(12) United States Patent
Rhee et al.

(10) Patent No.: US 7,519,449 B2
(45) Date of Patent: Apr. 14, 2009

(54) RENDERING SYSTEM AND METHOD AND RECORDING MEDIUM THEREFOR

(75) Inventors: Tae-hyun Rhee, Seoul (KR); Hoon Han, Seoul (KR); Kwang-jae Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 651 days.

(21) Appl. No.: 10/331,651

(22) Filed: Dec. 31, 2002

(65) Prior Publication Data

US 2003/0172366 A1   Sep. 11, 2003

(30) Foreign Application Priority Data

Mar. 11, 2002   (KR) .................... 2002-12975

(51) Int. Cl.
*G06F 19/00* (2006.01)

(52) U.S. Cl. ............... 700/182; 700/97; 700/98; 700/105; 345/419; 345/421; 717/100

(58) Field of Classification Search .......... 703/13; 706/919, 921; 717/100, 110; 345/582, 419, 345/421; 715/964; 700/182, 95–98, 105
See application file for complete search history.

(56) References Cited

U.S. PATENT DOCUMENTS

| | | | | |
|---|---|---|---|---|
| 5,966,310 A * | 10/1999 | Maeda et al. | ............ | 707/104.1 |
| 5,999,187 A * | 12/1999 | Dehmlow et al. | ............ | 345/420 |
| 6,384,821 B1 * | 5/2002 | Borrel et al. | ............ | 345/421 |
| 6,417,850 B1 * | 7/2002 | Kang | ............ | 345/422 |
| 6,445,974 B1 * | 9/2002 | Malaugh et al. | ............ | 700/182 |
| 6,718,218 B1 * | 4/2004 | Matheson | ............ | 700/95 |
| 6,721,614 B2 * | 4/2004 | Duncan et al. | ............ | 700/97 |
| 6,847,384 B1 * | 1/2005 | Sabadell et al. | ............ | 345/672 |
| 6,889,374 B1 * | 5/2005 | Wainwright | ............ | 717/115 |
| 6,985,835 B1 * | 1/2006 | Etzion et al. | ............ | 703/1 |
| 7,050,052 B2 * | 5/2006 | Shaikh | ............ | 345/421 |
| 7,099,725 B2 * | 8/2006 | Murrish et al. | ............ | 700/98 |
| 7,111,270 B2 * | 9/2006 | Neal et al. | ............ | 716/12 |

(Continued)

FOREIGN PATENT DOCUMENTS

JP   05-210745 A   8/1993

(Continued)

OTHER PUBLICATIONS

Chapter 1, Feb. 16, 1998, pp. 3-40 and extra page shows the creation of the PDF.*

(Continued)

*Primary Examiner*—Kamini S Shah
*Assistant Examiner*—Kibrom K Gebresilassie
(74) *Attorney, Agent, or Firm*—Sughrue Mion, PLLC

(57) ABSTRACT

A rendering system and method, and a recording medium therefor are provided. The rendering system imports geometry and hierarchy structure information on a three-dimensional (3D) computer-aided design (CAD) model, which is produced in a commercial 3D CAD system, from the 3D CAD system through an interface, performs scene editing necessary for rendering without changing the initially modeled data, and then performs rendering. Accordingly, it is not necessary to correct the geometry data and restore the hierarchy structure information, and rendering can be easily performed in a short time.

4 Claims, 8 Drawing Sheets

U.S. PATENT DOCUMENTS

| | | | |
|---|---|---|---|
| 7,283,135 B1 * | 10/2007 | Cote et al. | 345/428 |
| 7,337,030 B2 * | 2/2008 | Thomas et al. | 700/98 |
| 7,372,462 B2 * | 5/2008 | Harada | 345/424 |
| 2002/0026385 A1 * | 2/2002 | McCloskey et al. | 705/27 |
| 2002/0045963 A1 * | 4/2002 | Tenma et al. | 700/96 |
| 2002/0072884 A1 * | 6/2002 | El-Ratal | 703/2 |
| 2002/0093538 A1 * | 7/2002 | Carlin | 345/778 |
| 2002/0111972 A1 * | 8/2002 | Lynch et al. | 707/523 |
| 2002/0183986 A1 * | 12/2002 | Stewart et al. | 703/2 |
| 2003/0081849 A1 * | 5/2003 | Smith | 382/241 |
| 2003/0130758 A1 * | 7/2003 | Hirano et al. | 700/182 |
| 2003/0135846 A1 * | 7/2003 | Jayaram et al. | 717/137 |
| 2003/0202120 A1 * | 10/2003 | Mack | 348/578 |
| 2005/0034062 A1 * | 2/2005 | Bufkin et al. | 715/512 |
| 2005/0068316 A1 * | 3/2005 | Endo et al. | 345/419 |
| 2005/0108215 A1 * | 5/2005 | Thomas et al. | 707/3 |
| 2005/0144598 A1 * | 6/2005 | Sabadell et al. | 717/137 |
| 2006/0036756 A1 * | 2/2006 | Driemeyer et al. | 709/231 |

FOREIGN PATENT DOCUMENTS

JP 2000-137829 A 5/2000

OTHER PUBLICATIONS

J. Whyte, N. Bouchlaghem, A. Thorpe, and R. McCafer, "From CAD to Virtual reality: modelling approaches, data exhange and interactve 3D building design tools," 2000 Elsevier Science, pp. 43-55.*

J. Berta, "Integrating VR and CAD" 1999 IEEE, pp. 14-19.*

P. Pal, A. Kumar, "A hybrid approach for identification of 3D features from CAD database for manufacturing support", IJMT&M 42, 2002, 221-228.*

* cited by examiner

RENDERING SYSTEM AND METHOD AND RECORDING MEDIUM THEREFOR

BACKGROUND OF THE INVENTION

This application is based on Korean Patent Application No. 2002-12975 filed on Mar. 11, 2002, the disclosure of which is incorporated herein by reference in its entirety.

1. Field of the Invention

The present invention relates in general to a rendering system, and more particularly, to a rendering system and method for producing a realistic two-dimensional (2D) computer graphic (CG) image, which uses three-dimensional (3D) geometry data produced by a commercial 3D computer-aided design (CAD) system, and a recording medium for the same.

2. Description of the Related Art

Recently, CAD systems, and particularly 3D CAD systems, are widely used to design products. CAD systems include a CAD software, which is driven on a computer for-CAD operations, and programs and resources, which are related to the driving of the CAD software. Rendering systems include a rendering software, which is driven on a computer for rendering operations, and programs and resources, which are related to the rendering software.

When products to be mass-produced are designed using a CAD system, a realistic graphic image is required to verify and evaluate the design.

In order to effectively visualize a 3D model using a CAD system, it is necessary to exactly and realistically present the geometry and material of the products. This operation is referred to as a rendering.

When a CAD system does not include a rendering function or when a rendering function included in a CAD system is inadequate to produce an image having satisfactory quality desired by a user, an external CG rendering system providing a high-level rendering function is used to produce a CG rendering image for a 3D model.

In order to generate a high-level rendering image, using 3D CAD data that is modeled in a commercial 3D CAD system, and using an independent CG rendering system, the following processes are performed.

After storing 3D geometry data, i.e., 3D CAD data that has been completely modeled in a 3D CAD system, the geometry data is stored as an external file using a standard 3D CAD file storage function, i.e., a file export function, provided by a commercial 3D CAD software. Here, the stored standard 3D CAD file is an Initial Graphics Exchange Specification (IGES) file, the Standard for the Exchange of Product (STEP) Model Data file, or a standard 3D data file corresponding thereto. FIG. 9 shows the structure of an IGES file. Referring to FIG. 9, the IGES file just contains information on pieces of surface geometry data that are linearly arranged, but the IGES file does not contain information on a hierarchy structure in the geometries.

Next, the standard 3D data file is stored in a database (DB) of the CG rendering software using a data input function, i.e., a file import function, of the CG rendering software. Here, the data on the geometry hierarchy structure cannot be maintained, and some geometries may be changed. Thus, after the storing is completed, the geometry hierarchy structure data that has been lost during conversion into the standard 3D data file and the geometry data that has been transformed, due to the use of different systems, are corrected and restored.

After the geometry data and the geometry hierarchy structure data are completely corrected, scenes are edited for rendering. After the editing is completed, a high-level rendering process is performed to produce a final image. Ray tracing or A-Buffering is usually used for the high-level rendering.

In a conventional rendering system and method, an IGES file, i.e., a standard 3D data file that is used for data transmission between commercial CAD software and CG rendering software, does not include geometry hierarchy structure data, and errors may occur in geometry data during conversion into the standard 3D data file.

The geometry hierarchy structure data is necessary in order to edit scenes based on color/material in units of parts and to perform texture mapping, during scene editing for rendering using 3D CG rendering software. In addition, when the standard 3D data file is read into the CG rendering software, the CG rendering software needs to restore the lost geometry hierarchy structure data by creating an internal data structure that maintains the geometry hierarchy structure data and to provide a user interface allowing generation/editing of the internal data structure.

In addition, when errors occur in the geometry data, a user needs to correct the errors in the geometry data using a high-level 3D modeling function provided by the CG rendering software. In order to restore lost data, a user needs to correct the data defining the geometries and the hierarchy structure of the geometries in the CG rendering software. Here, the user's operation may take several hours through several days depending on the content of the modeling, the amount of lost data, and the performance of the correction function.

Additionally, the user may need to make a modification to the geometries after completion of scene editing for rendering. During the designing of a product to be mass-produced, the modification to the geometry of the product is usually performed in a 3D CAD system. The geometry modified in the 3D CAD system must be used in a rendering operation of a rendering system. Generally, when a commercial CG rendering software is used, the modified CAD geometry data is stored in a standard file format, and then read by the rendering system. Here, existing data about material, for example, is not preserved, and thus the previously designed data about material must be re-edited.

In addition, a light and a camera need to be appropriately setup for a rendering operation. This type of setup requires expert skills. However, in conventional rendering methods, a new setup is performed whenever a rendering operation is performed. Consequently, techniques are not shared, thereby increasing the operating time.

SUMMARY OF THE INVENTION

To solve the above-described and related problems, a first aspect of the present invention is to provide a rendering system and method for effectively performing three-dimensional (3D) rendering for commercial design, and a recording medium therefor.

A second aspect of the present invention is to provide a rendering system and method which include a data transferring system for maintaining 3D computer-aided design (CAD) geometries and geometry hierarchy structure data, which are initially modeled in a commercial 3D CAD system, and a recording medium therefor.

A third aspect of the present invention is to provide a rendering system and method for providing an efficient hierarchy structure of 3D data, which allows scenes to be easily edited while a hierarchy structure in the geometries, which is initially set in a 3D CAD system, is maintained, and a recording medium therefor.

A fourth aspect of the present invention is to provide an effective rendering system and method, which do not require an operation for restoring 3D geometries and a hierarchy structure in the geometries, and a recording medium therefor.

A fifth aspect of the present invention is to provide an effective rendering system and method, so when geometry data is modified after scene editing, the modified geometry data replaces old geometry data, but other related information such as information on material is maintained, and a recording medium therefor.

A sixth aspect of the present invention is to provide a rendering system and method, which allow environment setup data for a rendering operation to be easily shared, thereby allowing the rendering operation to be effectively performed, and a recording medium therefor.

In view of the aforementioned aspects of the present invention, there is provided a rendering system comprising a CAD interface which accesses a CAD system, directly imports CAD data produced in the CAD system, divides the CAD data into geometry data of a product and related data on other aspects, and converts the divided data; a database which stores the geometry data and the related data which has been divided and converted by the CAD interface; a scene editing module which edits a scene based on the geometry data using the related data; and a renderer which performs rendering on the scene that has been edited by the scene editing module.

In one illustrative, non-limiting embodiment, there is also provided a rendering method including a direct interfacing step of accessing a CAD system, importing CAD data from the CAD system, dividing the CAD data into geometry data of a product and related data on other aspects to be suitable to a structure of a database of a rendering system, and converting the divided data; a scene editing step of editing a scene based on the geometry data using the related data stored in the database; and a rendering step of rendering the scene that has been edited.

In another illustrative, non-limiting embodiment, there is provided a rendering method including accessing a CAD system, importing CAD data from the CAD system, dividing the CAD data into geometry data of a product and related data on other aspects to be suitable to a structure of a database of a rendering system, and converting the divided data; editing a scene based on the geometry data using the related data stored in the database; determining whether a modification to the edited scene is requested; if it is determined that the modification is requested, selecting a unit of data to be imported and import modified geometry data in the selected unit; comparing an imported part identification with a previously stored part identification; and if the two part identifications are the same, replacing existing geometry data corresponding to the part identification with the imported geometry data.

In still another illustrative, non-limiting embodiment, there is provided a rendering method including accessing a CAD system, importing CAD data from the CAD system, dividing the CAD data into geometry data of a product and related data on other aspects to be suitable to a structure of a database of a rendering system, and converting the divided data; editing a scene based on the geometry data using the related data stored in the database; and storing scene editing information, which is environment information necessary for scene editing among the related data, as a separate file.

There is also provided a recording medium on which a program for executing any one of the above-described rendering methods on a computer is recorded.

There is also provided a database of a rendering system, the database contains geometrical information which is geometry data for each 3D geometry; geometry hierarchy structure data on the hierarchy structure in the geometries indicated by the geometry data; rendering information which is related data necessary for rendering; and scene editing information which is environment-related information necessary for scene editing.

BRIEF DESCRIPTION OF THE DRAWINGS

The above aspects and advantages of the present invention will become more apparent by describing in detail exemplary embodiments thereof with reference to the attached drawings in which.

DETAILED DESCRIPTION OF THE INVENTION

Hereinafter, illustrative, non-limiting embodiments of the present invention will be described in detail with reference to the attached drawings.

Figure 1:
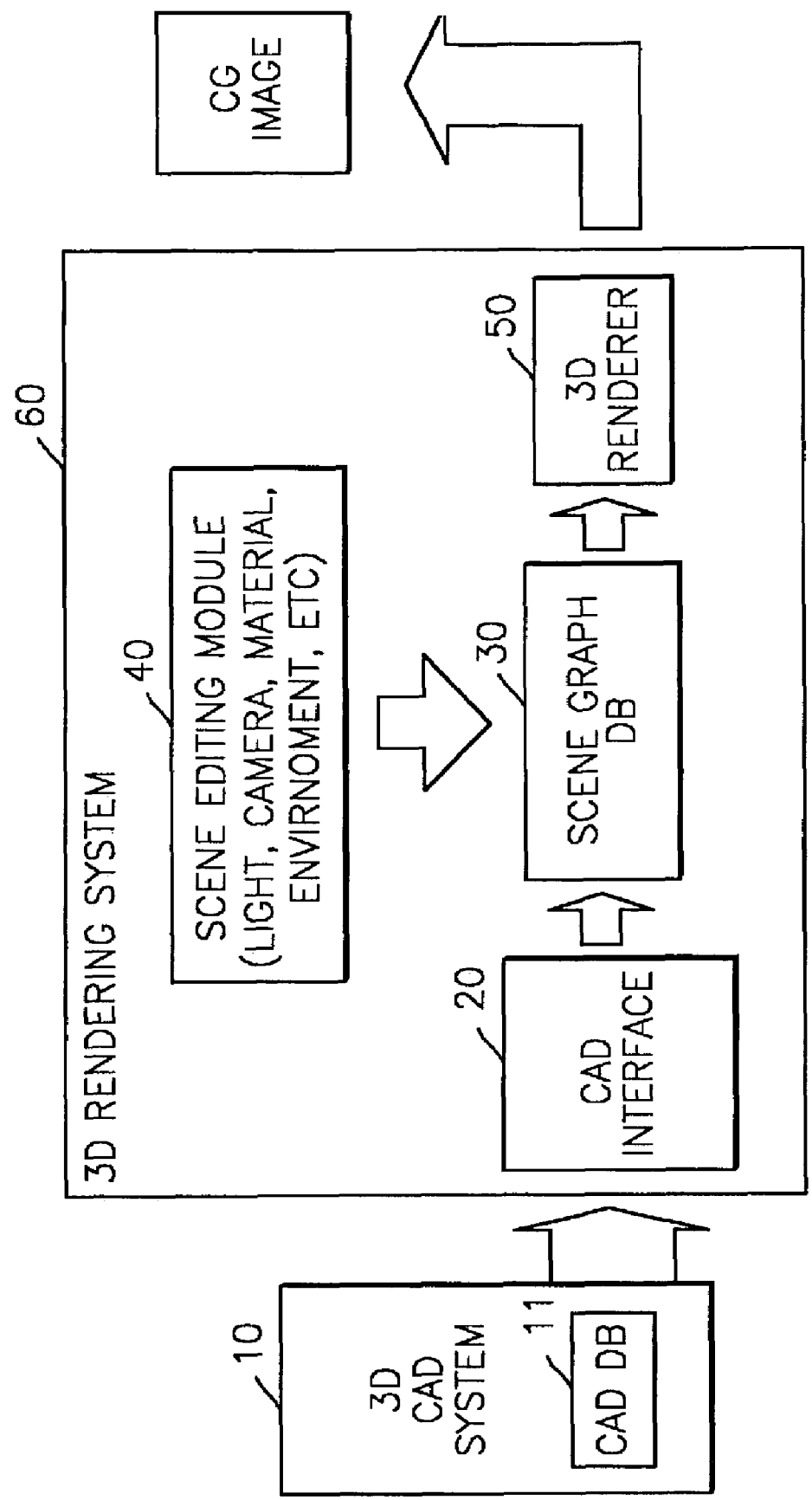
FIG. 1 is a block diagram of a rendering system according to an exemplary embodiment of the present invention.

FIG. 1 is a block diagram of a rendering system 60 according to an exemplary embodiment of the present invention. Referring to FIG. 1, the rendering system 60 comprises a computer-aided design (CAD) interface 20, a scene graph database (DB) 30, a scene editing module 40, and a three-dimensional (3D) renderer 50. The operation of the rendering system 60 will be briefly described with reference to FIG. 1.

CAD software and rendering software are driven on a computer. These two kinds of software can be driven by directly and separately executing the execution files of the software on the computer, by either executing the CAD software and then executing the rendering software through an interface provided within the CAD software, or by executing the rendering software and then executing the CAD software through an interface provided within the rendering software.

Next, the CAD interface 20 connects the rendering system to a 3D CAD system 10 using an application program interface (API) provided by the CAD software in order to import data from the 3D CAD system 10, which includes assembly, part and surface geometry data contained as CAD data from a CAD DB 11 of the 3D CAD system 10. The CAD interface 20 converts the data into a format suitable to a hierarchy structure having a scene graph type used in the rendering system 60, and stores the converted data in a scene graph DB 30. When importing the CAD data from the 3D CAD system 10, the CAD interface 20 may import the data of all assemblies and parts, which are displayed on a CAD software screen, one at a time, or it may import the data of a desired assembly or part, which is selected using a picking function provided by the CAD software.

Scene graph data that is stored in the scene graph DB 30 via the CAD interface 20 contains data on CAD geometries, a hierarchy structure in the geometries, and a basic material defined in the 3D CAD system 10. This data is directly imported from the 3D CAD system 10 through the CAD interface 20, and scene editing is performed on the data by the scene editing module 40 without correcting the geometries and the geometry hierarchy structure.

The original CAD data can be visualized on a screen of the computer by displaying the scene graph data in a two-dimensional (2D) computer graphic image using a real-time rendering method such as OpenGL, or by displaying the scene graph data in a hierarchy tree structure.

The scene editing can be divided into geometry-based editing with respect to assemblies, parts, and surfaces, which are subordinate objects to geometry data; and environment-based -editing with respect to object information other than the geometry data, i.e., a light, a camera, an environment, rendering attributes, and system parameters, etc. The geometry-based editing includes material mapping and texture mapping, which are performed in units of geometries. The environment-based editing includes editing data on, for example, light and camera, which have no relation with a geometry, but influence an entire scene.

For the geometry-based editing, an object to be edited is selected. The object may be an assembly, a part, or a surface, and if an upper-level object is selected in a hierarchy tree structure, all lower-level objects subordinate to the upper-level object are selected. For example, if an assembly is selected, all parts constituting the assembly and all surfaces constituting each part are selected. Data, such as a material and a position which are necessary for rendering, is edited with respect to the selected object, and the edited result is applied to all lower-level objects subordinate to the selected upper-level object. Other information such as light, camera, environment, and rendering, etc., is edited. The edited scene graph data is stored again in the scene graph DB 30.

The 3D renderer 50 renders the edited scene graph data stored in the scene graph DB 30 and generates a 2D computer graphic image for the 3D CAD data.

Figure 2:
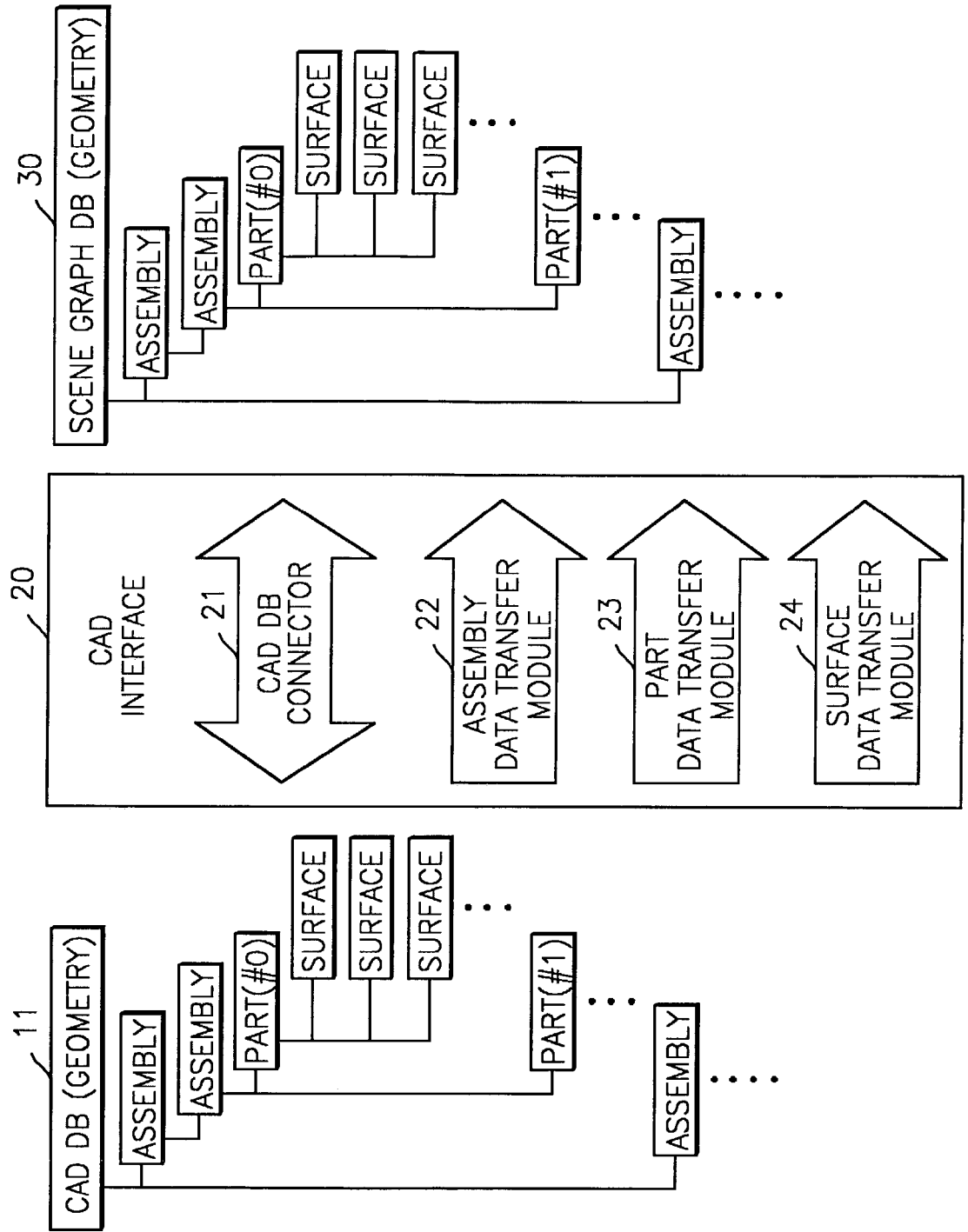
FIG. 2 is a diagram showing the structure of a computer-aided design (CAD) interface and transmission of geometry data according to an exemplary embodiment of the present invention.

FIG. 2 is a diagram showing the structure of the CAD interface 20 and transmission of geometry data according to an exemplary embodiment of the present invention. The CAD interface 20 comprises a CAD DB connector 21, an assembly data transfer module 22, a part data transfer module 23, and a surface data transfer module 24.

A hierarchy structure of the CAD DB 11 of the 3D CAD system 10 is shown on the left side of the CAD DB connector 21. The hierarchy structure in the geometries in the 3D CAD data that has been completely modeled in the 3D CAD system 10 is composed of a surface, which is a lowest-level unit, a part, which is a set of surfaces, and an assembly, which is a set of parts. Surface data contains 3D geometry information in the form of a free-formed surface such as a Non-Uniform Rational B-Spline (NURBS) surface or in the form of a polygon mesh. A hierarchy structure of the scene graph DB 30 of the rendering system 60 is shown on the right side of the CAD DB connector 21. Here, the hierarchy structures of the two DBs 11 and 30 are the same.

The operation of the CAD interface 20 will be described in detail with reference to FIG. 2. The CAD DB connector 21 connects the rendering system 60 to the CAD DB 11 of the 3D CAD system 10 using the API of the 3D CAD system 10 to generate a transmission path through which CAD data can be imported.

Next, the assembly data transfer module 22 imports assembly data from the CAD DB 11 of the 3D CAD system 10 and converts the assembly data. When converting the assembly data, the assembly data transfer module 22 detects an assembly structure in the 3D CAD system 10 and converts the assembly data into scene graph data for the rendering system 60 based on the detected assembly structure, so that the same hierarchy structure can be maintained. In a scene graph in the rendering system 60, the assembly data is stored as a set of parts. In a general scene-graph concept such as an open inventor or virtual reality modeling language (VRML), the assembly data is stored in the form of a representable hierarchy group.

Next, the part data transfer module 23 imports part data from the CAD DB 11 of the 3D CAD system 10 and converts the part data. When converting the part data, the part data transfer module 23 also converts material information and position transformation of the part data. Here, the part data is stored in the form of a list of all surfaces constituting the part, so that the scene editing module 40 can select and edit each surface, and is stored such that a hierarchy structure among the part and the surfaces can be maintained. The material and position transformation information of the part stored in the scene graph is applied to lower-level data, i.e., all of the surfaces. This is the same as a hierarchy data processing method in a general scene graph. For part-based data synchronization with the 3D CAD system 10, an identification (ID) of the part is stored in the part data in the scene graph DB 30.

Next, the surface data transfer module 24 imports surface data from the CAD DB 11 of the 3D CAD system 10 and converts it. The surface data is stored in a surface list. The surface data is divided into material information and geometrical information and is converted into scene graph information for the rendering system 60. Here, the geometrical information may be imported in the form of a polygonal mesh according to the API provided by the 3D CAD system 10 and stored. Alternatively, the geometrical information is imported in the form of a free-formed surface, such as a NURBS, and stored in the scene graph DB 30, and is then reconstructed into data of a polygonal mesh format, which is necessary for visualization within the rendering system 60. For the material information, if material information has been edited in units of surfaces in the 3D CAD system 10, the material information of each surface is stored in the scene graph DB 30. Otherwise, material information stored in a part, at an upper-level above the surface, is stored as the material information of the surface in the scene graph DB 30.

The above-described conversion is not a conversion into an external file format, but is performed using the API provided by the CAD software.

After completion of data transmission, the rendering system 60 does not need to be connected to the 3D CAD system 10 with the exception that a new event occurs, and the execution of the CAD software may be terminated.

Figure 3:
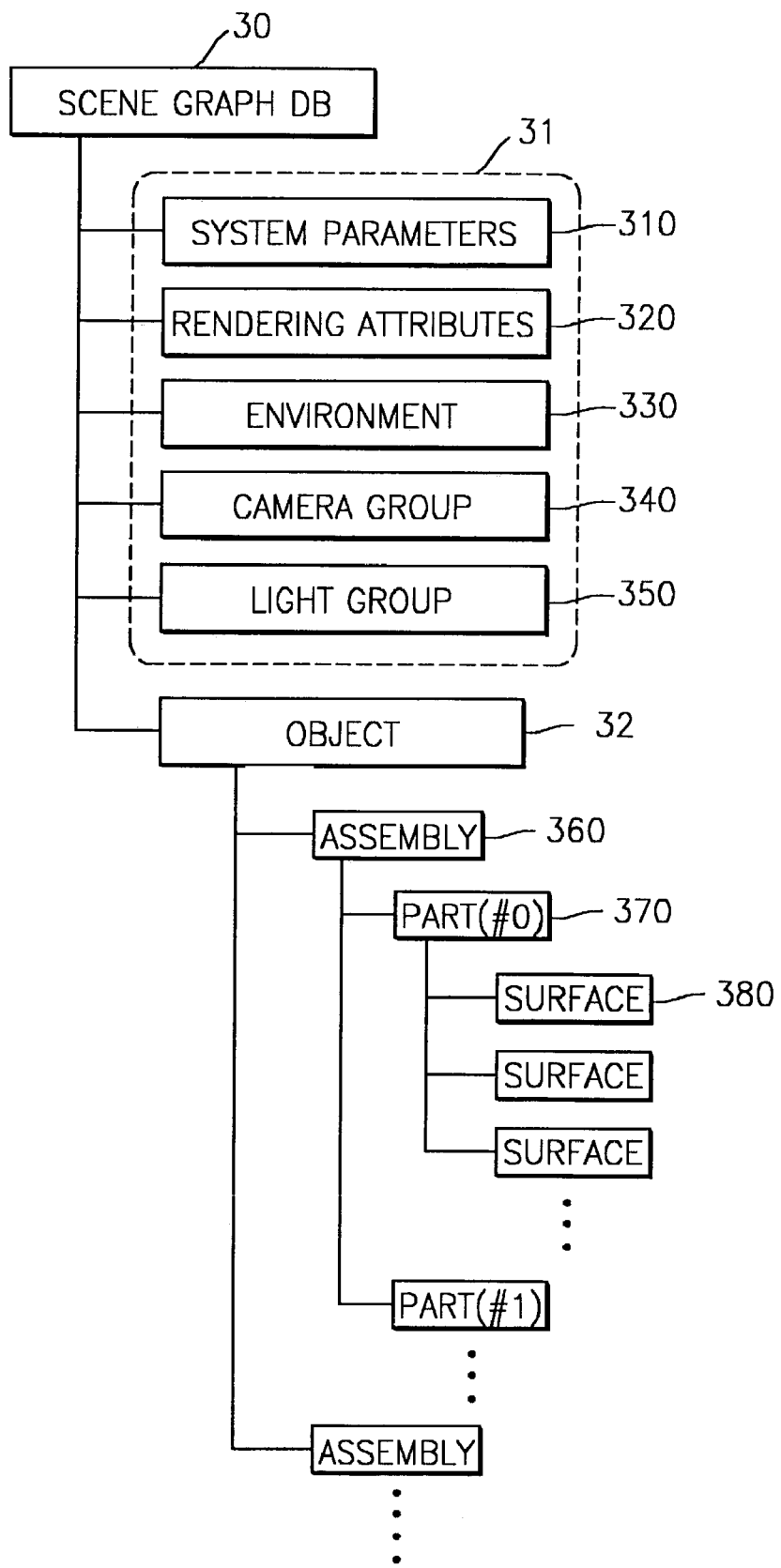
FIG. 3 is a diagram of the structure of a scene graph database (DB) according to an exemplary embodiment of the present invention.

FIG. 3 is a diagram of a hierarchy structure of the scene graph DB 30 according to an exemplary embodiment of the present invention. The scene graph DB 30 is largely composed of geometry data 32 of an object and other related data 31. The related data 31 is composed of system parameters 310, rendering attributes 320, an environment 330, a camera group 340, and a light group 350. The geometry data 32 has a hierarchy structure including an assembly 360, a part 370, and a surface 380.

Scene graph data can be stored as a built-in file within the scene graph DB 30, and the stored file can be read and restored into a format before being stored as a file. Editing data stored as a built-in file or performing rendering using the data can be accomplished only with rendering software on a computer, even if CAD software is not installed in the computer. In addition, the related data 31 such as the system parameters 310, the rendering attributes 320, the environment 330, the camera group 340, and the light group 350, except the geometry data 32, may be selected and stored as a separate external file. More specifically, information to be stored is selected through a user interface. The selected information is extracted from the scene graph DB 30 and is stored in a file format. The stored file can be read and imported into the rendering system 60 using a file read function. The file includes information on a system; rendering attributes, an environment, a camera, and a light, etc., which is necessary to perform rendering and thus can be used as basic data when rendering is performed on similar products thereafter.

Figure 4:
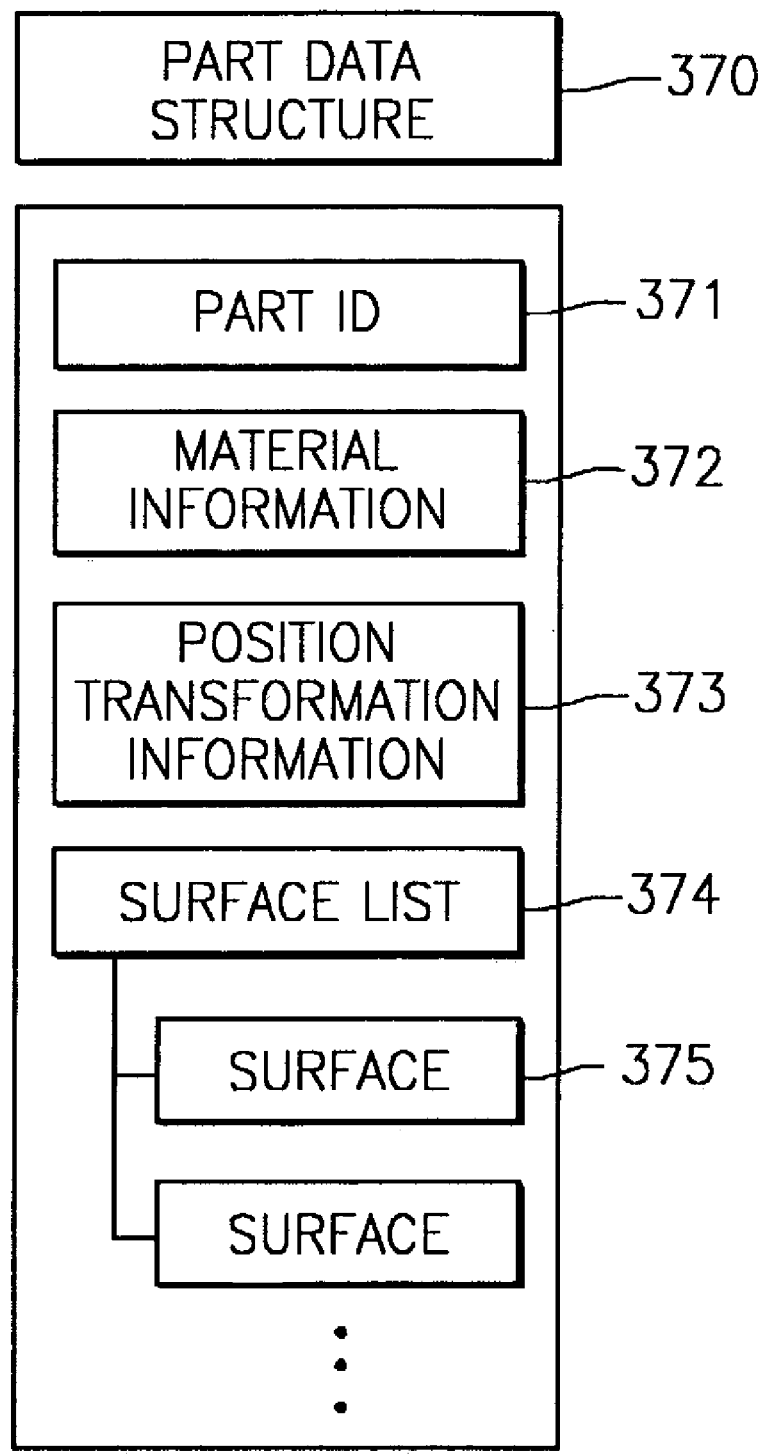
FIG. 4 is a diagram of the structure of part data according to an exemplary embodiment of the present invention.

FIG. 4 is a diagram of a part data structure 370 according to an exemplary embodiment of the present invention. The part data structure 370 is composed of a part ID 371, material information 372, position transformation information 373, a surface list 374, and a plurality of surface data 375.

The part ID 371 contains information for part-based data synchronization with the 3D CAD system 10. The material information 372 contains information on the material of a relevant part. The position transformation information 373 may be stored in the form of, for example, a 4×4 matrix, and contains information on rotation, movement, magnification, and reduction, etc. The surface list 374 is a list of all surfaces constituting the part. The surface data 374 is stored in the form of a list so that the scene editing module 40 can perform selection and editing in units of surfaces and that a hierarchy structure among the part and the surfaces can be maintained. The material information 372 and the position transformation information 373 contained in the part data are applied to all surfaces subordinate to the part in the same manner as hierarchy information processing used in a general scene graph such as an open inventor or VRML.

Figure 5:
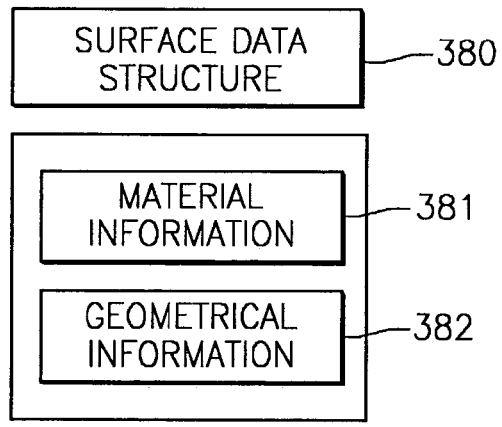
FIG. 5 is a diagram of the structure of surface data according to an exemplary embodiment of the present invention.

FIG. 5 is a diagram of a surface data structure 380 according to an exemplary embodiment of the present invention. The surface data structure 380 is composed of material information 381 and geometrical information 382.

If material information has been edited in units of surface in the 3D CAD system 10, the material information 381 contains information on the material of a relevant surface. Otherwise, the material information contains a material value stored in a part at an upper level above the surface. The geometrical information 382 is stored in the form of a polygonal mesh.

Figure 6:
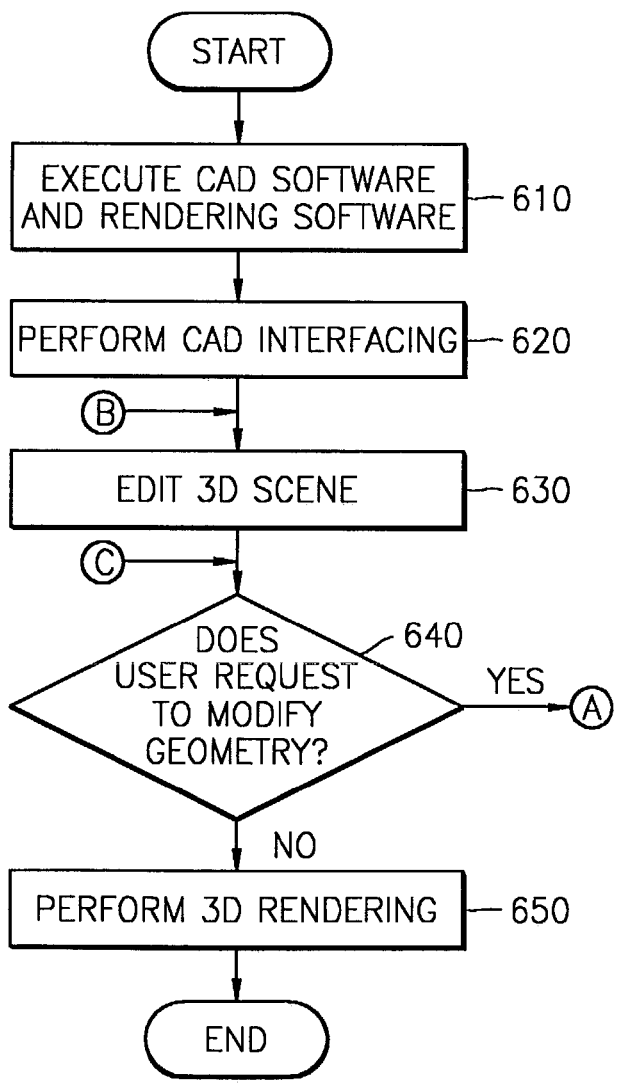
FIG. 6 is a flowchart of the operation of a rendering system according to an exemplary embodiment of the present invention.

FIG. 6 is a flowchart of the operation of a rendering system according to an exemplary embodiment of the present invention. Referring to FIGS. 1 and 6, when a user executes CAD software and rendering software on a computer in step 610, the CAD interface 20 of the rendering system 60 performs CAD interfacing by importing CAD data from the CAD DB 11 of the 3D CAD system 10 using an API provided by the CAD software; dividing the CAD data into geometry data of a product and other related data in accordance with the structure of the scene graph DB 30 of the rendering system 60, and converting the divided data in step 620. The scene editing module 40 edits a scene, which is based on the geometry data stored in the scene graph DB 30, using the related data in step 630. Next, the rendering system determines whether a user requests to modify a geometry with respect to the edited scene in step 640. If it is determined that there is no request for modification, the 3D renderer 50 performs rendering in step 650.

Figure 7:
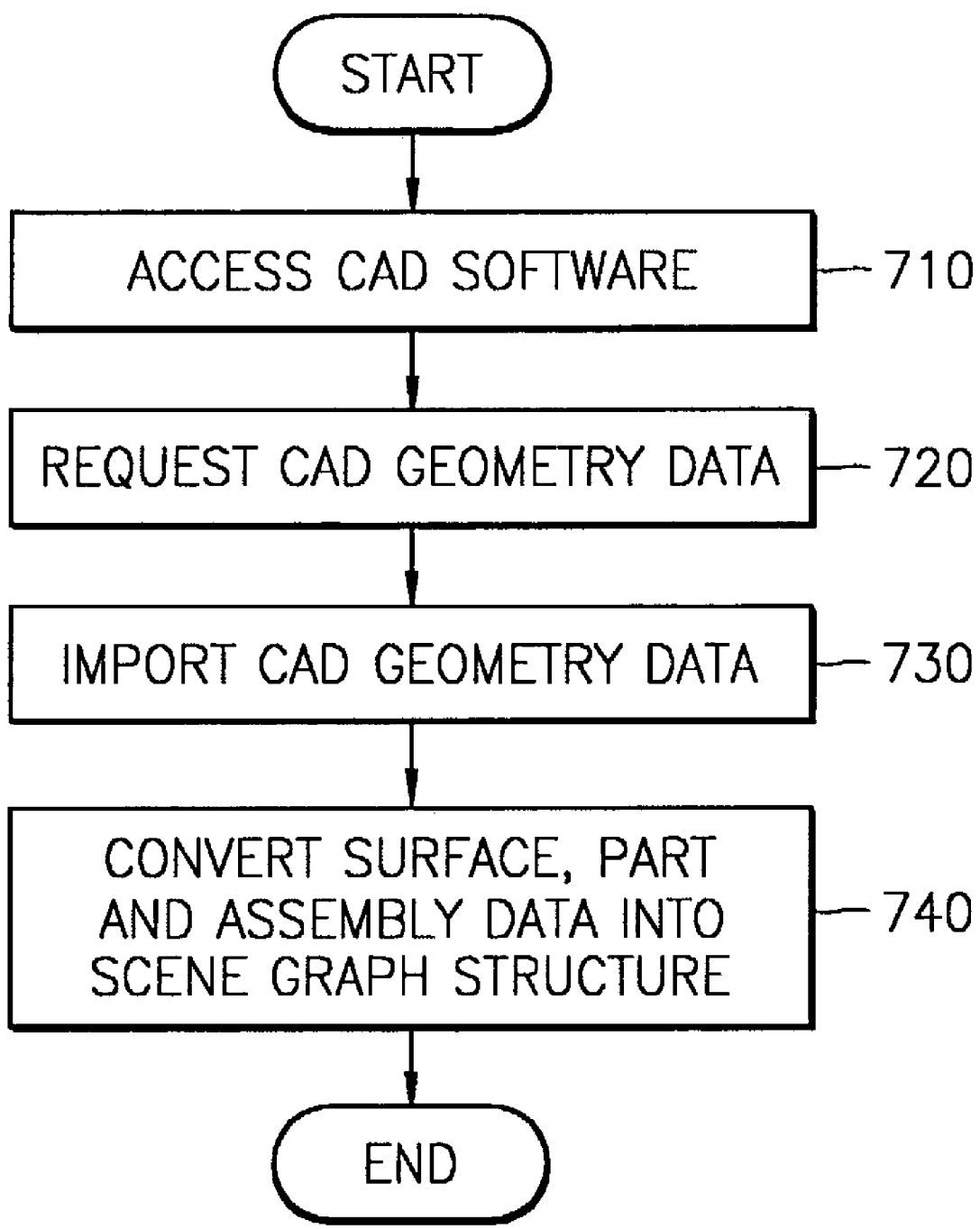
FIG. 7 is a flowchart of a CAD interfacing procedure according to an exemplary embodiment of the present invention.

FIG. 7 is a flowchart of a CAD interfacing procedure according to an exemplary embodiment of the present invention. FIG. 7 shows sub-steps of the step 620 shown in FIG. 6.

Referring to FIGS. 1, 2 and 7, the CAD DB connector 21 connects the rendering system 60 to the CAD DB 11 of the 3D CAD system 10 using an API of the 3D CAD system 10 in step 710. Next, the CAD DB connector 21 requests geometry data from the 3D CAD system 10 in step 720. When the 3D CAD system 10 is ready to transmit the geometry data, the geometry data such as assembly data, part data, and surface data are imported from the CAD DB 11 of the 3D CAD system 10 into the assembly data transfer module 22, the part data transfer module 23, and the surface data transfer module 24, respectively, in step 730. Next, the assembly data, part data, and surface data are converted into the structure of the scene graph DB 30 in step 740.

Figure 8:
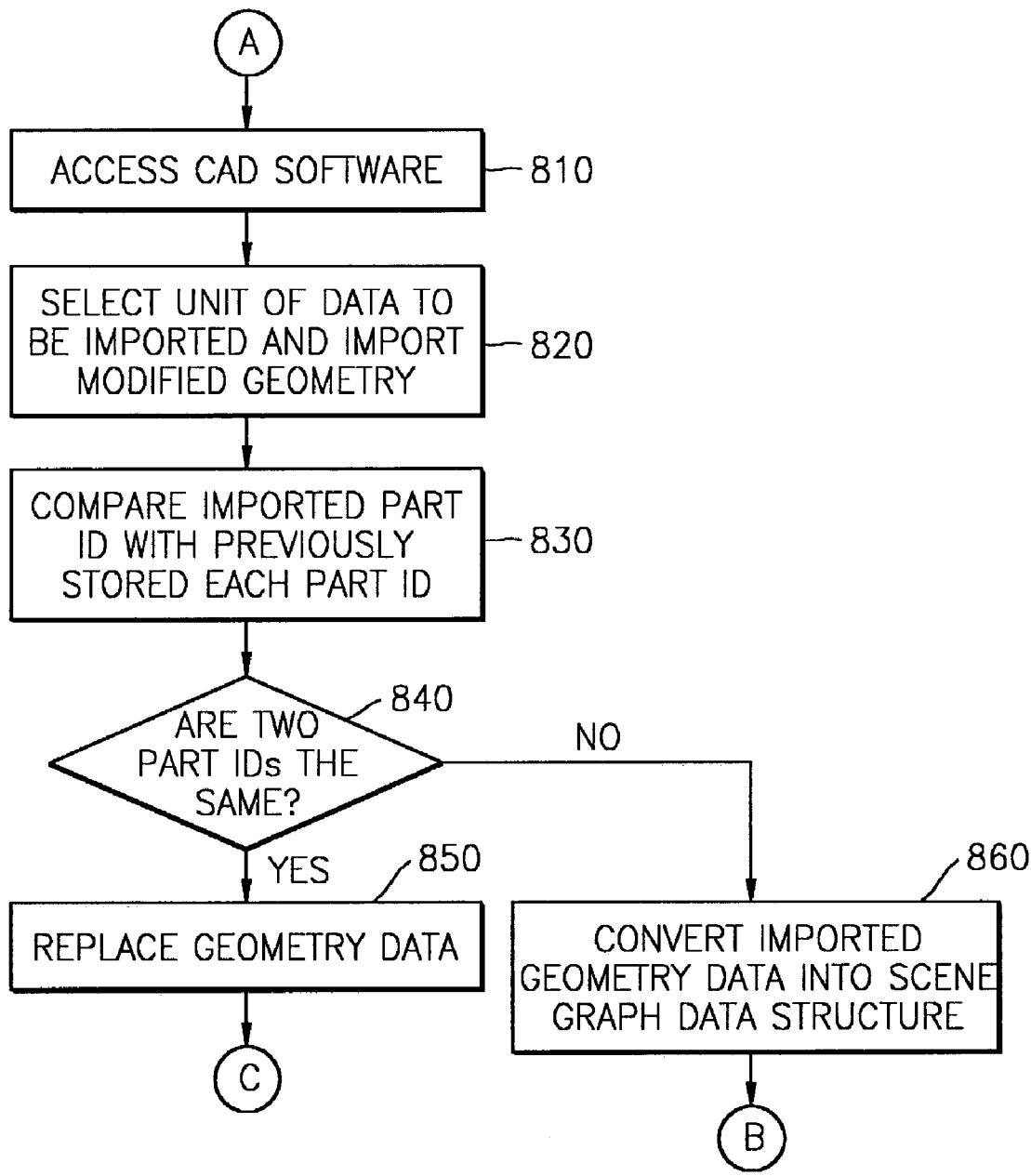
FIG. 8 is a flowchart of a procedure of replacing geometry data according to an exemplary embodiment of the present invention.
Figure 9:
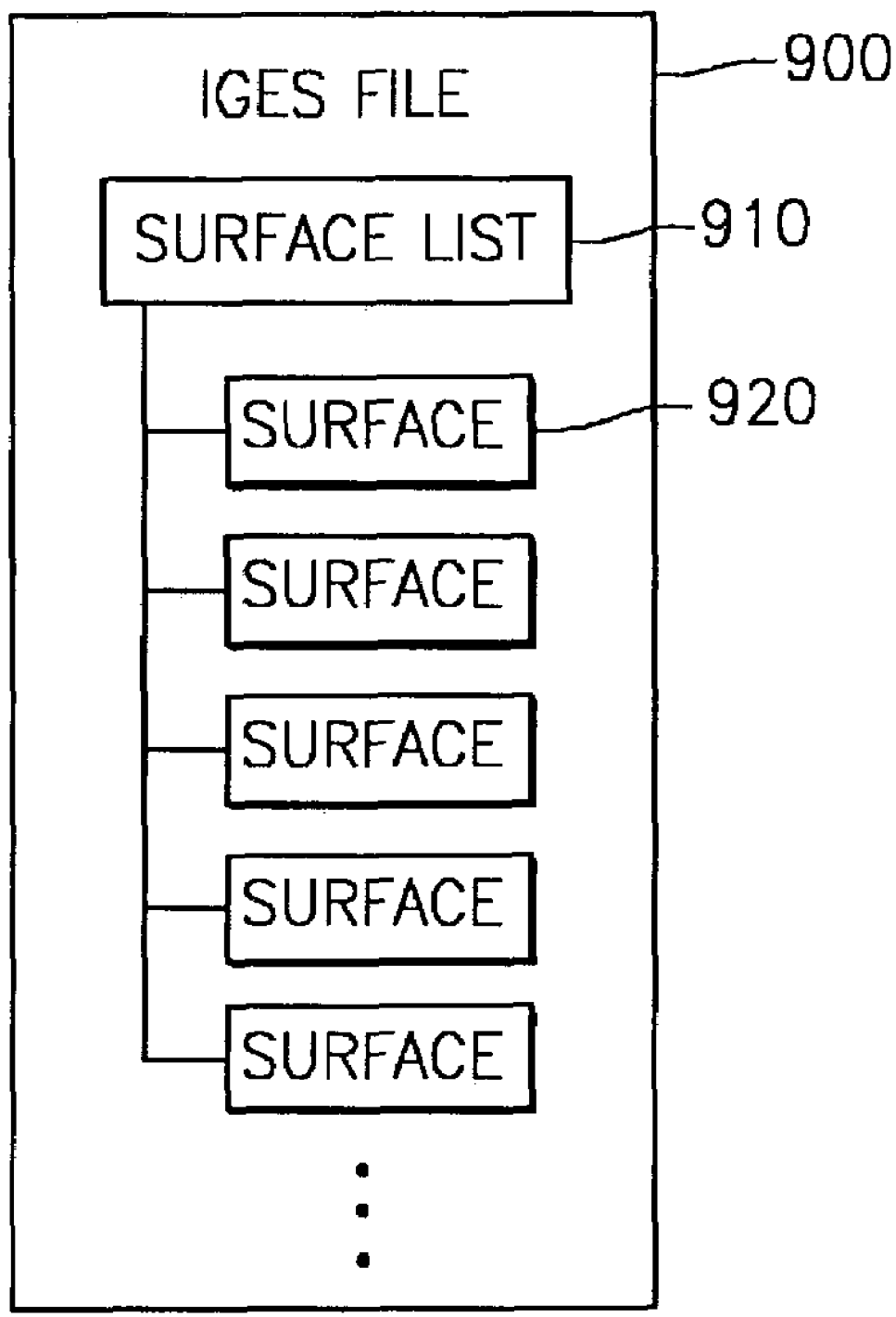
FIG. 9 is a diagram showing the structure of a conventional Initial Graphics Exchange Specification (IGES) file.

FIG. 8 is a flowchart of a procedure of replacing geometry data according to an exemplary embodiment of the present invention. The replacing is performed when it is determined that the user requests to modify the geometry in step 640 shown in FIG. 6.

The CAD DB connector 21 of the CAD interface 20 connects the rendering system 60 to the 3D CAD system 10 in step 810. Next, a unit of data to be imported is selected, and only modified geometry data is imported from the 3D CAD system 10. Next, a part ID of the modified geometry data imported from the 3D CAD system 10 is compared with each part ID stored in the scene graph DB 30 of the rendering system 60 in step 830. If it is determined that the compared two part IDs are the same, the geometry data of a part corresponding to the part ID is replaced with the imported geometry data (i.e., part data) in step 850. Here, only geometrical information is replaced, but existing material information and information on environments such as a light and a camera are maintained as they are. If it is determined that the two part IDs are different in step 840, the imported geometry data (i.e., part data) is converted into a scene graph data structure in step 860.

The present invention can be embodied as a computer readable code which is recorded in a computer readable medium. Here, the computer readable medium may be any recording apparatus capable of storing data that can be read by a computer system, e.g., a read-only memory (ROM), a random access memory (RAM), a compact disc (CD)-ROM, a magnetic tape, a floppy disk, an optical data storage device, and so on. The computer readable recording medium can be dispersively installed in a computer system connected to a network and stored and accomplished as a computer readable code by a distributed computing environment.

As described above, according to the present invention, 3D CAD geometries and hierarchy structure information, which are initially modeled in a commercial 3D CAD system, can be maintained, thereby allowing scenes to be easily edited. Since it is not necessary to restore initial 3D geometries and hierarchy structure in the geometries, the rendering time can be reduced. When geometry data is modified after scene editing, only the modified geometry data replaces old geometry data, but other related data is maintained, thereby reducing time necessary to modify geometries. Since environment setup data is separately stored to allow information for a rendering operation to be easily shared, the operating time is reduced.

The present invention is not restricted to the above-described illustrative, non-limiting embodiments, and it will be apparent that various changes can be made by those skilled in the art without departing from the spirit of the invention.

What is claimed is:

1. A rendering method comprising:
accessing a computer-aided design (CAD) system, importing CAD data from a CAD database of the CAD system, dividing the CAD data into geometry data of a product and related data on other aspects to be suitable to a structure of a database of a rendering system, and converting the divided data into a format of the rendering system;
editing, by the rendering system, a scene based on the geometry data using the related data stored in the database;
determining whether a modification to the edited scene is requested;
if it is determined that the modification is requested, selecting a unit of data to be imported and importing modified geometry data in the selected unit;
comparing an imported part identification with a previously stored part identification; and
if the imported part identification and the previously stored part identification are the same, replacing existing geometry data corresponding to the part identification with the imported geometry data,
wherein the geometry data of a product comprises assembly data and wherein the related data on the other aspects comprises attributes and parameters unrelated to the assembly.

2. A rendering method comprising:
interfacing which includes accessing a computer-aided design (CAD) system, directly importing CAD data from a CAD database of the CAD system into a separate and independent rendering system, dividing the CAD data into geometry data of a product and related data on aspects other than geometry of the product to be suitable to a structure of a rendering database of the rendering system, wherein the geometry data of a product comprises assembly data and wherein the related data on the other aspects comprises attributes and parameters unrelated to the assembly, and converting the divided data into a format of the rendering system;
editing, by the rendering system, a scene based on the geometry data using the related data stored in the database;
rendering, by the rendering system, the scene that has been edited,
directly interfacing by a rendering system interface with the CAD database of a CAD system to obtain modified data regarding geometry data and the related data;
comparing identifier of the obtained modified data with identifiers of the data stored in the rendering database of the rendering system; and
when the identifier of the obtained modified data matches an identifier of the data stored in the rendering database, replacing only the geometry data corresponding to the identifier in the rendering database and keeping the related data corresponding to the identifier in the rendering database unchanged.

3. A rendering method comprising:
accessing a computer-aided design (CAD) system, importing CAD data from a CAD database of the CAD system, dividing the CAD data into geometry data of a product and related data on aspects other than geometry of the product to be suitable to a structure of a rendering database of a rendering system, wherein the geometry data of a product comprises assembly data and wherein the related data on the other aspects comprises attributes and parameters unrelated to the assembly, and converting the divided data into a format of the rendering system;
editing, by the rendering system, a scene based on the geometry data using the related data stored in the database;
determining whether a modification to the edited scene is requested;
if it is determined that the modification is requested, selecting a unit of data to be imported and importing modified geometry data in the selected unit;
comparing an imported part identification with a previously stored part identification;
if the imported part identification and the previously stored part identification are the same, replacing existing geometry data corresponding to the part identification with the imported geometry data; if the imported part identification and the previously stored part identification do not match, converting imported geometry data into scene graph data structure.

4. A rendering method comprising:
accessing a computer-aided design (CAD) system, importing CAD data from the CAD system, dividing the CAD data into geometry data of a product and related data on aspects other than geometry of the product to be suitable to a structure of, wherein the geometry data of a product comprises assembly data and wherein the related data on the other aspects comprises attributes and parameters unrelated to the assembly, and converting the divided data into a format of the rendering system;
editing a scene based on the geometry data using the related data stored in the database; and
storing scene editing information, which is environment information necessary for scene editing among the related data, as a separate file, wherein the environment information has no relation to the geometry data and influences the entire scene;
directly interfacing by a rendering system interface with a CAD database of the CAD system to obtain modified data regarding the geometry data and the related data;
comparing identifier of the obtained modified data with identifiers of the data stored in a rendering database of the rendering system; and
when the identifier of the obtained modified data matches an identifier of the data stored in the rendering database, replacing only the geometry data corresponding to the identifier in the rendering database and keeping the related data corresponding to the identifier in the rendering database unchanged.

* * * * *